United States Patent
Taguchi et al.

(10) Patent No.: US 8,266,552 B2
(45) Date of Patent: Sep. 11, 2012

(54) PATTERN GENERATING METHOD, METHOD OF MANUFACTURING SEMICONDUCTOR DEVICE, AND RECORDING MEDIUM

(75) Inventors: Takafumi Taguchi, Kanagawa (JP); Toshiya Kotani, Tokyo (JP); Michiya Takimoto, Kanagawa (JP); Fumiharu Nakajima, Kanagawa (JP); Ryota Aburada, Kanagawa (JP); Hiromitsu Mashita, Kanagawa (JP); Katsumi Iyanagi, Kanagawa (JP); Chikaaki Kodama, Kanagawa (JP)

(73) Assignee: Kabushiki Kaisha Toshiba, Tokyo (JP)

(*) Notice: Subject to any disclaimer, the term of this patent is extended or adjusted under 35 U.S.C. 154(b) by 312 days.

(21) Appl. No.: 12/705,640

(22) Filed: Feb. 15, 2010

(65) Prior Publication Data

US 2010/0241261 A1    Sep. 23, 2010

(30) Foreign Application Priority Data

Mar. 23, 2009 (JP) ................................. 2009-070976

(51) Int. Cl.
- *G06F 17/50* (2006.01)
- *G06F 19/00* (2011.01)
- *G05B 13/04* (2006.01)

(52) U.S. Cl. ............... 716/50; 716/53; 716/54; 716/55; 700/96; 700/104; 700/121

(58) Field of Classification Search ............ 716/50, 716/53, 54, 55; 700/98, 104, 121
See application file for complete search history.

(56) References Cited

U.S. PATENT DOCUMENTS

| | | | |
|---|---|---|---|
| 7,120,882 B2 | 10/2006 | Kotani et al. | |
| 7,194,704 B2 | 3/2007 | Kotani et al. | |
| 7,281,222 B1* | 10/2007 | Babcock | 716/53 |
| 2002/0091985 A1* | 7/2002 | Liebmann et al. | 716/19 |
| 2003/0229412 A1* | 12/2003 | White et al. | 700/121 |
| 2005/0076316 A1* | 4/2005 | Pierrat et al. | 716/4 |
| 2005/0087809 A1* | 4/2005 | Dokumaci et al. | 257/365 |
| 2005/0132306 A1* | 6/2005 | Smith et al. | 716/1 |
| 2005/0153217 A1* | 7/2005 | Izuha et al. | 430/5 |
| 2006/0206851 A1* | 9/2006 | Van Wingerden et al. | 716/19 |

(Continued)

FOREIGN PATENT DOCUMENTS

JP    08-055908    2/1996

(Continued)

OTHER PUBLICATIONS

Notice of Rejection issued by the Japanese Patent Office on Jun. 21, 2011, for Japanese Patent Application No. 2009-070976, and English-language translation thereof.

*Primary Examiner* — Stacy Whitmore
*Assistant Examiner* — Magid Dimyan
(74) *Attorney, Agent, or Firm* — Finnegan, Henderson, Farabow, Garrett & Dunner, L.L.P.

(57) ABSTRACT

Pattern formation simulations are performed based on design layout data subjected to OPC processing with a plurality of process parameters set in process conditions. A worst condition of the process conditions is calculated based on risk points extracted from simulation results. The design layout data or the OPC processing is changed such that when a pattern is formed under the worst condition based on the changed design layout data or the changed OPC processing a number of the risk points or a risk degree of the risk points of the pattern is smaller than the simulation result.

18 Claims, 12 Drawing Sheets

U.S. PATENT DOCUMENTS

2006/0236271 A1* 10/2006 Zach .............................. 716/1
2011/0154281 A1* 6/2011 Zach ............................ 716/112

FOREIGN PATENT DOCUMENTS

| JP | 8-76348 | 3/1996 |
| JP | 2000-81697 | 3/2000 |
| JP | 2000-155408 | 6/2000 |
| JP | 2000-235248 | 8/2000 |
| JP | 2001-350250 | 12/2001 |
| JP | 2002-131882 | 5/2002 |
| JP | 2005-134520 | 5/2005 |
| JP | 2006-58452 | 3/2006 |
| JP | 2006-337668 | 12/2006 |

* cited by examiner

PATTERN GENERATING METHOD, METHOD OF MANUFACTURING SEMICONDUCTOR DEVICE, AND RECORDING MEDIUM

CROSS-REFERENCE TO RELATED APPLICATIONS

This application is based upon and claims the benefit of priority from the prior Japanese Patent Application No. 2009-070976, filed on Mar. 23, 2009; the entire contents of which are incorporated herein by reference.

BACKGROUND OF THE INVENTION

1. Field of the Invention

The present invention relates to a pattern generating method, a method of manufacturing a semiconductor device, and a computer program product.

2. Description of the Related Art

According to the microminiaturization of semiconductor devices in recent years, defects due to manufacturing fluctuation, particles, and the like increase to make it extremely difficult to improve yield. As a method of microminiaturizing semiconductor devices, for example, there are a method of reducing wavelength of a light source (an exposure beam) and a method of increasing a numerical aperture (NA) of a lens. However, the method of reducing wavelength of a light source, the method of increasing a numerical aperture of a lens, and the like cannot meet the request for microminiaturization of semiconductor devices that advances with increasing speed.

According to the request for microminiaturization of semiconductor devices, for example, there is a demand for formation of patterns having a pattern pitch finer than a minimum pattern pitch that can be formed by the usual lithography technology. As one of methods of forming such a fine pattern, a pattern forming technology by a so-called sidewall formation process is known (see, for example, Japanese Patent Application Laid-Open No. H8-55908).

In a process that undergoes processing steps many times from lithography to final circuit pattern formation like the sidewall formation process, it is likely that a resist pattern formed by the lithography changes to a risk point (a section where a pattern formation failure occurs) through the processing process even if no problem is found in lithography verification. It is also likely that a new risk point occurs because of processing fluctuation during mass production.

BRIEF SUMMARY OF THE INVENTION

A pattern generating method according to an embodiment of the present invention comprises: preparing design layout data of a semiconductor integrated circuit pattern; performing pattern formation simulations based on the design layout data subjected to OPC processing with a plurality of process parameters set in process conditions in a predetermined range; calculating, as a worst condition, based on risk points having likelihood of causing a pattern formation failure higher than a predetermined value, a process condition having a process parameter that brings about a worst result when pattern formation is performed among the process parameters, the risk point being extracted from simulation results of the pattern formation simulations; and changing the design layout data or the OPC processing such that when a pattern is formed under the worst condition based on the changed design layout data or the changed OPC processing a number of the risk points or a risk degree of the risk points of the pattern is smaller than the simulation result.

A method of manufacturing a semiconductor device according to an embodiment of the present invention comprises: preparing design layout data of a semiconductor integrated circuit pattern; performing pattern formation simulations based on the design layout data subjected to OPC processing with a plurality of process parameters set in process conditions in a predetermined range; calculating, as a worst condition, based on risk points having likelihood of causing a pattern formation failure higher than a predetermined value, a process condition having a process parameter that brings about a worst result when pattern formation is performed among the process parameters, the risk point being extracted from simulation results of the pattern formation simulations; changing the design layout data or the OPC processing such that when a pattern is formed under the worst condition based on the changed design layout data or the changed OPC processing a number of the risk points or a risk degree of the risk points of the pattern is smaller than the simulation result and forming a pattern on a wafer based on the changed design layout data or the changed OPC processing.

A computer program product executable by a computer and having a computer readable recording medium includes a plurality of commands for determining a pattern according to an embodiment of the present invention, wherein the commands cause the computer to execute: preparing design layout data of a semiconductor integrated circuit pattern; extracting risk points having likelihood of causing a pattern formation failure higher than a predetermined value from a result obtained by executing pattern formation simulations on the design layout data subjected to OPC processing using process conditions in which a plurality of parameters are set in a predetermined range; calculating, as a worst condition, based on the extracted risk points, a process condition having a process parameter that brings about a worst result when pattern formation is performed among the process parameters; and changing the design layout data or the OPC processing such that when a pattern is formed under the worst condition based on the changed design layout data or the changed OPC processing a number of the risk points or a risk degree of the risk points of the pattern is smaller than the simulation result.

DETAILED DESCRIPTION OF THE INVENTION

Exemplary embodiments of the present invention are explained in detail below with reference to the accompanying drawings. The present invention is not limited by the embodiments.

Figure 1:
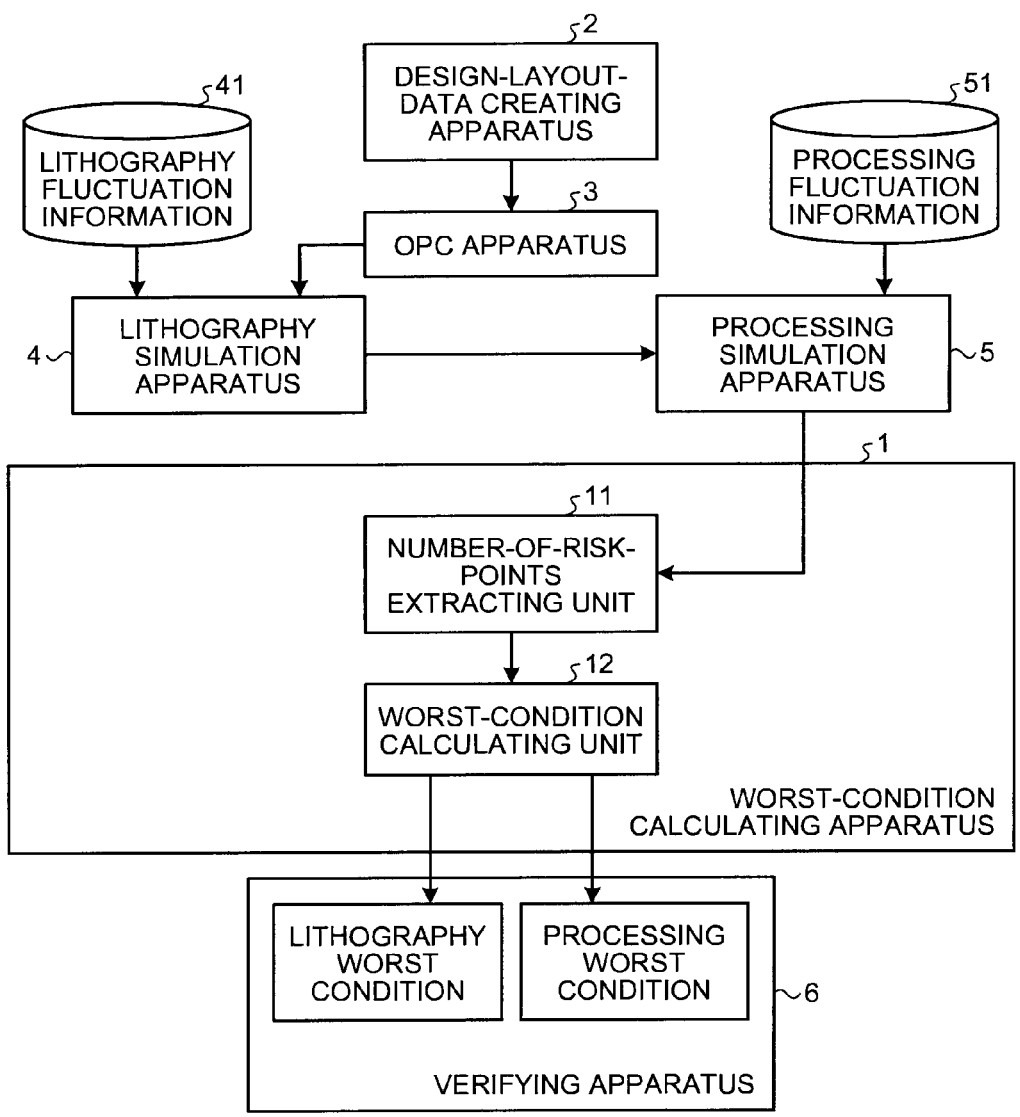
FIG. 1 is a block diagram of the configuration of a pattern forming system including a worst-condition calculating apparatus according to a first embodiment of the present invention.

FIG. 1 is a block diagram of the configuration of a pattern forming system including a worst-condition calculating apparatus according to a first embodiment of the present invention. The pattern forming system is a system configured to generate mask data used in forming a semiconductor integrated circuit pattern and forming patterns on a substrate such as a wafer using a mask manufactured by using the mask data. The pattern generating system generates mask data for forming patterns by processing, at least once, a film to be processed.

The pattern forming system according to this embodiment performs a lithography simulation and a processing simulation taking into account fluctuation in lithography and fluctuation in processing to thereby simulatively generate patterns formed on a substrate. The pattern forming system calculates, based on the simulatively-generated pattern, worst process conditions (a worst lithography condition and a worst processing condition). In this embodiment, to reduce the number of risk points (sections highly likely to change to pattern formation failures) after pattern formation even under the worst process condition, design layout data (a design layout pattern), optical proximity correction (OPC), process conditions (e.g., a lighting condition and an etching condition), and the like are changed to change patterns such as a mask pattern, a design layout pattern, and patterns on substrate. Patterns are formed on a substrate by using the changed mask pattern. In this way, a mask pattern with occurrence of risk points suppressed is formed. The OPC in this embodiment can be only the OPC or OPC including process and proximity correction (PPC).

In the following explanation, in some case, the lithography simulation and the processing simulation are collectively referred to as pattern formation simulation. In the explanation of this embodiment, the pattern formation simulation is performed by taking into account fluctuation in lithography and fluctuation in processing. However, the pattern formation simulation can be performed based on only the fluctuation in lithography. The pattern formation simulation can be performed based on only the fluctuation in processing.

The pattern forming system includes a worst-condition calculating apparatus 1, a design-layout-data creating apparatus 2, an OPC apparatus 3, a lithography simulation apparatus 4, a processing simulation apparatus 5, and a verifying apparatus 6.

The design-layout-data creating apparatus 2 is a computer or the like that creates design layout data of patterns to be formed. The OPC apparatus 3 is a computer or the like that applies OPC processing to the design layout data created by the design-layout-data creating apparatus 2 and creates mask data after OPC.

The lithography simulation apparatus 4 performs a lithography simulation using the mask data after OPC. The lithography simulation apparatus 4 according to this embodiment performs a lithography simulation using lithography fluctuation information 41. The lithography fluctuation information 41 is fluctuation values in various lithography conditions (an exposure amount, a focus value, exposure wavelength, etc.) used in performing lithography.

The lithography fluctuation information has, for each of lithography conditions, a lithography reference value (e.g., a set exposure amount) set in performing lithography and a lithography fluctuation value obtained by applying predetermined fluctuation to the lithography reference value. The lithography reference value is a best condition in performing lithography. The lithography fluctuation value is a deviation amount from the lithography reference value. The lithography fluctuation value indicates that likelihood of deviation from the lithography reference value in lithography is higher than a predetermined value. In the following explanation, in some case, the lithography reference value and the lithography fluctuation value are collectively referred to as lithography simulation set value (a lithography parameter in process parameters). When lithography is performed, a deviation amount from the lithography reference value is likely to occur. Therefore, in this embodiment, a lithography simulation using the deviation amount (the lithography fluctuation value) and a lithography simulation using the lithography reference value are performed. In other words, the lithography simulation apparatus 4 according to this embodiment performs the lithography simulation taking into account fluctuation in lithography conditions used in performing lithography.

The processing simulation apparatus 5 performs a processing simulation using a simulation result of the lithography simulation. The processing simulation apparatus 5 according to this embodiment performs the processing simulation based on processing fluctuation information 51. The processing fluctuation information 51 is fluctuation values in various processing conditions used in performing processing such as etching and film formation.

The processing fluctuation information 51 has, for each of the processing conditions, a processing reference value (e.g., a set slimming amount in a sidewall formation process) set in performing processing and a processing fluctuation value obtained by applying predetermined fluctuation to the processing reference value. The processing reference value is a best condition in performing processing. The processing fluctuation value is a deviation amount from the processing reference value. The processing fluctuation value indicates that likelihood of deviation from the processing reference value in processing is higher than a predetermined value. In the following explanation, in some case, the processing reference value and the processing fluctuation value are collectively referred to as processing simulation set value (a processing parameter in process parameters). When processing is performed, a deviation amount from the processing reference value is likely to occur. Therefore, in this embodiment, a processing simulation using the deviation amount (the processing fluctuation value) and a processing simulation using the processing reference value are performed. In other words, the lithography simulation apparatus 4 according to this embodiment performs the processing simulation taking into account fluctuation in processing conditions used in performing processing.

The worst-condition calculating apparatus 1 calculates verification conditions (worst conditions) used for lithography verification and processing verification using a simulation result derived by the processing simulation apparatus 5. The worst-condition calculating apparatus 1 according to this embodiment calculates, as verification conditions, a worst condition in performing lithography (hereinafter, "lithography worst condition") and a worst condition in performing processing (hereinafter, "processing worst condition"). Specifically, the worst-condition calculating apparatus 1 determines the lithography worst condition out of lithography simulation set values in the lithograph fluctuation information 41. The worst-condition calculating apparatus 1 determines the processing worst condition out of processing simulation set values in the processing fluctuation information 51.

The worst-condition calculating apparatus 1 includes a number-of-risk-points extracting unit 11 and a worst-condition calculating unit 12. The number-of-risk-points extracting unit 11 extracts, for each of the lithography simulation set values of the lithography conditions specified in the lithography fluctuation information 41, the number of risk points that occur when patterns are formed under the lithography conditions. The number-of-risk-points extracting unit 11 extracts, for each of the processing simulation set values of the processing conditions specified in the processing fluctuation information 51, the number of risk points that occur when patterns are formed under the processing conditions.

Thresholds as determination references for determining whether a pattern is a risk point are set in the number-of-risk-points extracting unit 11 in advance. The thresholds set in the number-of-risk-point extracting unit 11 are a threshold of space width and a threshold of line width. The number-of-risk-points extracting unit 11 extracts a risk point by comparing the set threshold and a dimension of patterns obtained by a pattern formation simulation. The number-of-risk-point extracting unit 11 extracts a pattern narrower than the threshold of space width as a risk point and extracts a pattern narrower than the threshold of line width as a risk point. The pattern narrower than the threshold of space width is a section where a pattern is highly likely to be short and the pattern narrower than the threshold of line width is a section where a pattern is highly likely to be open.

The worst-condition calculating unit 12 calculates, according to a factor analysis, a lithography condition under which the number of risk points is the largest as a lithography worst condition. The worst-condition calculating unit 12 calculates, according to the factor analysis, a processing condition under which the number of risk points is the largest as a processing worst condition. The worst-condition calculating unit 12 sends the calculated lithography worst condition and processing worst condition to the verifying apparatus 6. The verifying apparatus 6 performs lithography verification using the lithography worst condition and performs processing verification using the processing worst condition.

Figure 2:
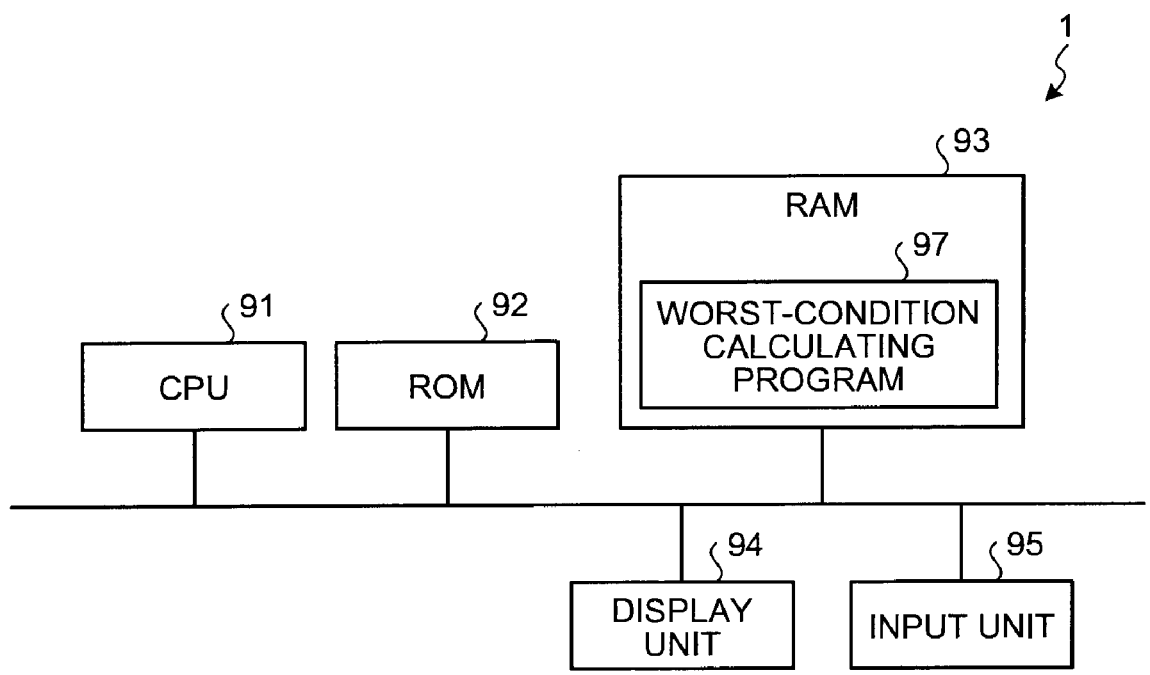
FIG. 2 is a diagram of the hardware configuration of the worst-condition calculating apparatus.

FIG. 2 is a diagram of the hardware configuration of the worst-condition calculating apparatus 1. The worst-condition calculating apparatus 1 is an apparatus such as a computer that calculates verification conditions used for lithography verification and processing verification. The worst-condition calculating apparatus 1 includes a central processing unit (CPU) 91, a read only memory (ROM) 92, a random access memory (RAM) 93, a display unit 94, and an input unit 95. In the worst-condition calculating apparatus 1, the CPU 91, the ROM 92, the RAM 93, the display unit 94, and the input unit 95 are connected to one another via a bus line.

The CPU 91 calculates verification conditions using a worst-condition calculating program 97, which is a computer program for calculating the lithography worst condition and the processing worst condition as the verification conditions.

The display unit 94 is a display device such as a liquid crystal monitor. The display unit 94 displays, based on instructions from the CPU 91, the design layout data, the mask data after OPC, a lithography simulation result, a processing simulation result, risk points, the number of risk points, the lithography fluctuation information 41, the processing fluctuation information 51, the worst lithography condition, the worst lithography condition, and the like. The input unit 95 includes a mouse and a keyboard. The input unit 95 receives the input of instruction information (parameters, etc. necessary for calculation of verification conditions) externally input from a user. The instruction information input to the input unit 95 is sent to the CPU 91.

The worst-condition calculating program 97 is stored in the ROM 92 and loaded into the RAM 93 via the bus line. The CPU 91 executes the worst-condition calculating program 97 loaded into the RAM 93. Specifically, in the worst-condition calculating apparatus 1, according to an instruction input from the input unit 95 by the user, the CPU 91 reads out the worst-condition calculating program 97 from the ROM 92, expands the worst-condition calculating program 97 in a program storage area in the RAM 93, and executes various kinds of processing. The CPU 91 causes the data storage area formed in the RAM 93 to temporarily store various data generated in the various kinds of processing.

Figure 3:
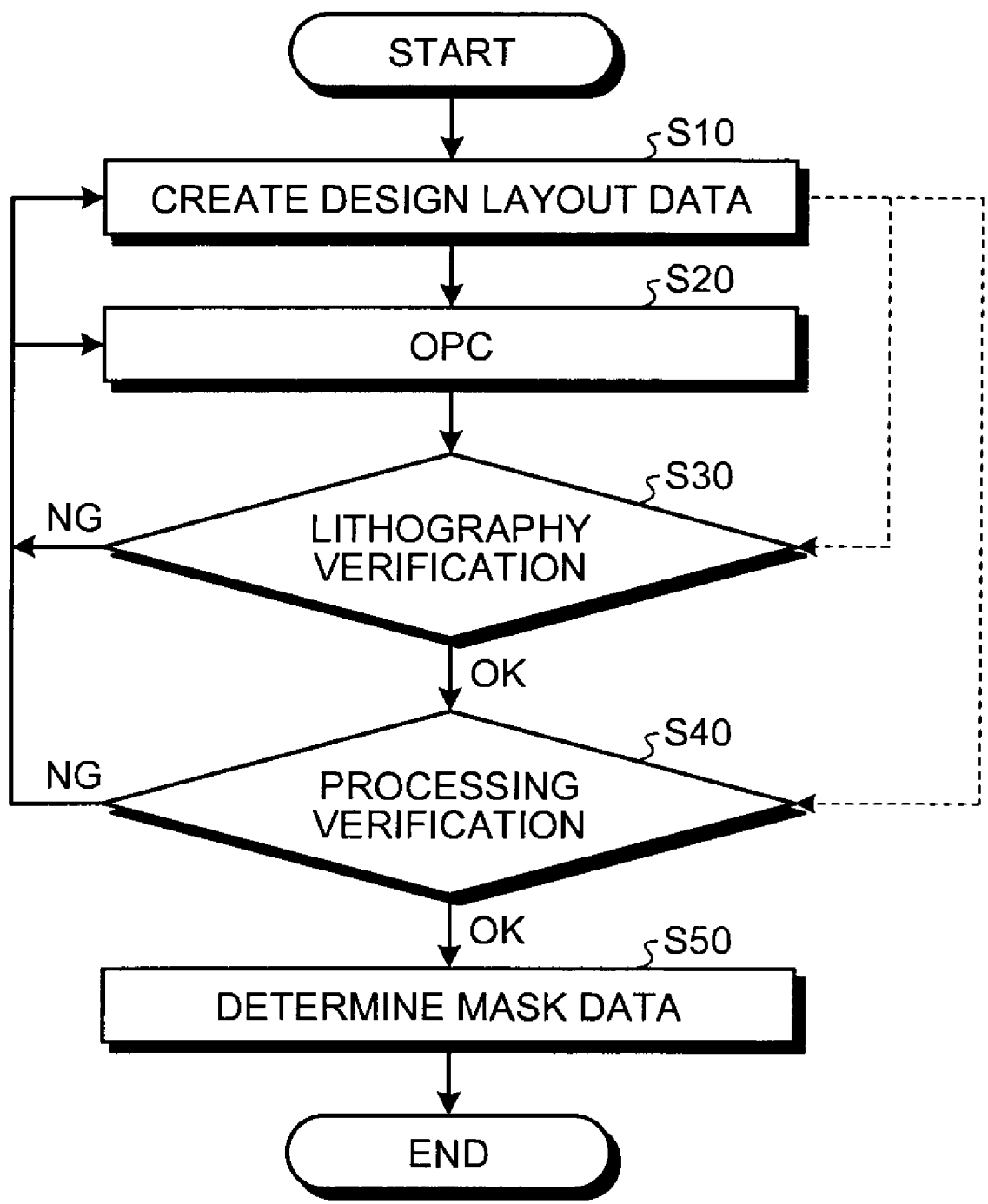
FIG. 3 is a flowchart for explaining an operation procedure of the pattern forming system according to the first embodiment.

FIG. 3 is a flowchart for explaining an operation procedure of the pattern forming system according to the first embodiment. In the pattern forming system, the design-layout-data creating apparatus 2 creates design layout data of patterns (step S10). Thereafter, the pattern forming system performs processing for calculating a lithography worst condition and a processing worst condition. Specifically, the OPC apparatus 3 applies provisional OPC processing to the design layout data to create provisional mask data after OPC. The lithography simulation apparatus 4, the processing simulation apparatus 5, and the worst-condition calculating apparatus 1 calculate a lithography worst condition and a processing worst condition.

When the lithography worst condition and the processing worst condition are calculated, OPC processing (step S20) is not performed. The verifying apparatus 6 performs lithography verification using the provisional mask data after OPC and the lithography worst condition (step S30) and performs processing verification using the processing worst condition (step S40). Specifically, the verifying apparatus 6 performs a lithography simulation and a processing simulation and determines, based on simulation results, presence or absence of a risk point.

In the verifying apparatus 6, a threshold as a determination reference for determining whether a pattern is a risk point is set in advance. The threshold set in the verifying apparatus 6 is a threshold same as the threshold set in the number-of-risk-points extracting unit 11. The verifying apparatus 6 extracts a risk point using the set threshold and the simulation results. The verifying apparatus 6 extracts, according to processing same as the processing of the number-of-risk-points extracting unit 11, a risk point that occurs when patterns are formed under the lithography worst condition and the processing worst condition.

When the verifying apparatus 6 extracts a risk point in the lithography verification ("NG" at step S30) or when the verifying apparatus 6 extracts a risk point in the processing verification ("NG" at step S40), the design layout data, the OPC, the process conditions, and the like are changed.

In changing the design layout data, the design-layout-data creating apparatus 2 creates design layout data anew (step S10). The OPC apparatus 3 applies OPC processing to the design layout data to create mask data after OPC (step S20). Thereafter, the verifying apparatus 6 performs the lithography verification using the lithography worst condition and the mask data created at step S20 (step S30) and performs the processing verification using the processing worst condition (step S40).

In changing the OPC, the OPC apparatus 3 applies new OPC processing to the design layout data to create mask data after OPC (step S20). Thereafter, the verifying apparatus 6 performs the lithography verification using the lithography worst condition and the mask data created at step S20 (step S30) and performs the processing verification using the processing worst condition (step S40).

In changing the process conditions, for example, a set slimming amount in a sidewall formation process is changed. Thereafter, the verifying apparatus 6 performs the lithography verification using the lithography worst condition (step S30) and performs the processing verification using the processing worst condition (step S40). In changing the process conditions, as in changing the OPC, the OPC apparatus 3 can apply new OPC processing to the design layout data to create the mask data after OPC.

The pattern forming system repeats processing for changing any one of the design layout data, the OPC, and the process conditions until the verifying apparatus 6 does not extract a risk point in the lithography verification and the processing verification. When the verifying apparatus 6 does not extract a risk point in the lithography verification ("OK" at step S30) and when the verifying apparatus 6 does not extract a risk point in the processing verification ("OK" at step S40), the pattern forming system determines, as mask data for mask creation, mask data after OPC in which no risk point is extracted (step S50).

Figure 4:
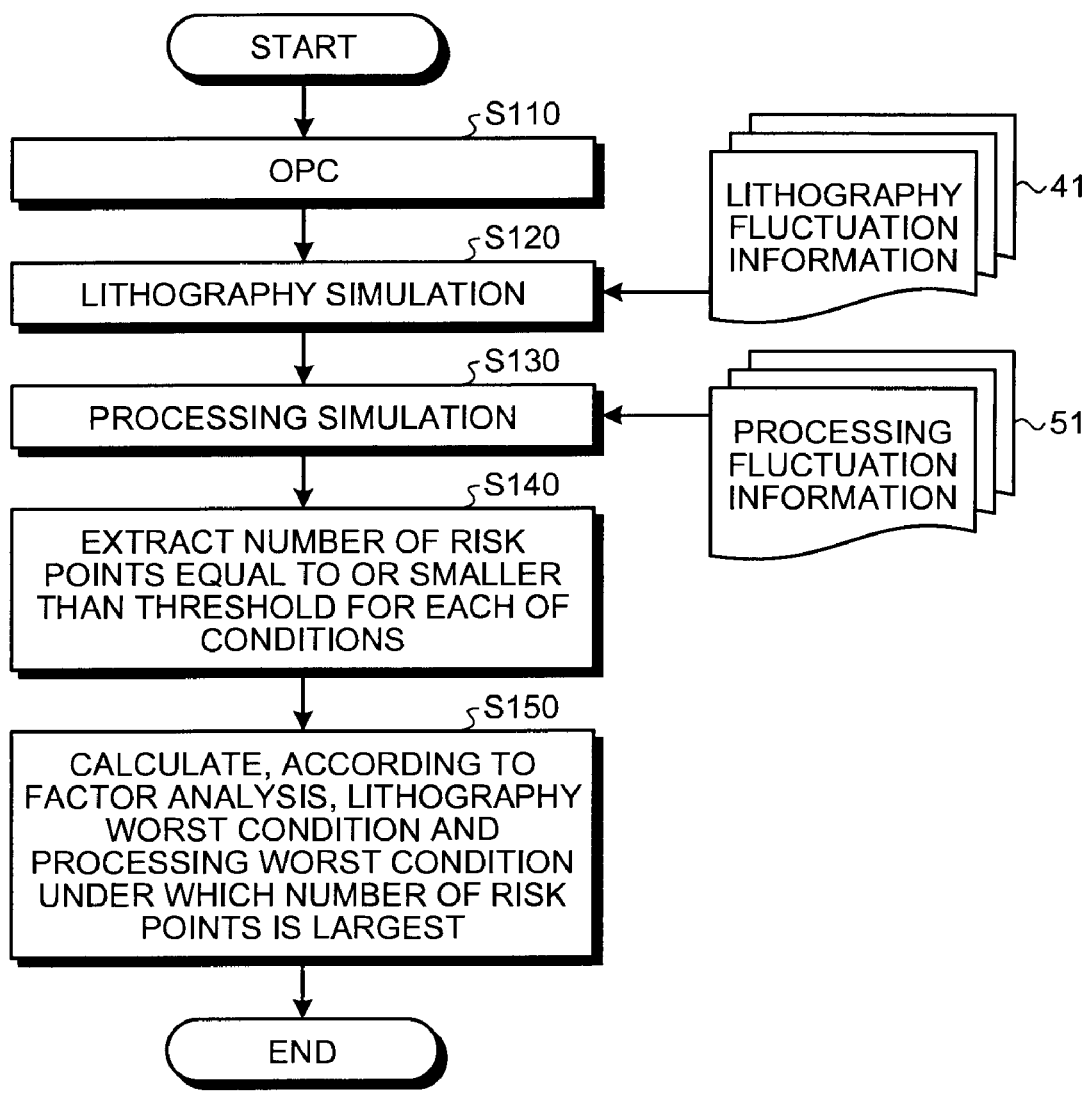
FIG. 4 is a flowchart for explaining a procedure of processing for calculating a worst condition.

FIG. 4 is a flowchart for explaining a procedure of processing for calculating a worst condition. The OPC apparatus 3 applies provisional OPC processing to design layout data created by the design-layout-data creating apparatus 2 to create provisional mask data after OPC (step S110).

The lithography simulation apparatus 4 performs a lithography simulation using the mask data after OPC and the lithography fluctuation information 41 (step S120). The lithography fluctuation information 41 includes at least one kind of lithography condition among, for example, a mask (a pattern formation dimension on the mask), an exposure amount (dose), a focus value, exposure wavelength, an illumination shape, an illumination luminance distribution, a lens numerical aperture, a polarization degree, aberration, and pupil transmittance.

The processing simulation apparatus 5 performs a processing simulation using a simulation result of the lithography simulation and the processing fluctuation information 51 (step S130). The processing fluctuation information 51 includes at least one kind of processing condition among, for example, a slimming amount and a sidewall deposit amount in the sidewall formation process. Fluctuation specified by the lithography fluctuation information 41 and the processing fluctuation information 51 include at least one kind of fluctuation that could occur in a wafer surface, between wafers, between lots, between apparatuses, between products, and in aged deterioration.

In the following explanation, the pattern forming system generates mask data used in the sidewall formation process. The lithography fluctuation information 41 is fluctuation in a mask, a dose, focus, and illumination σ. The processing fluctuation information 51 is fluctuation in a slimming amount and a sidewall deposit amount.

Figure 5:
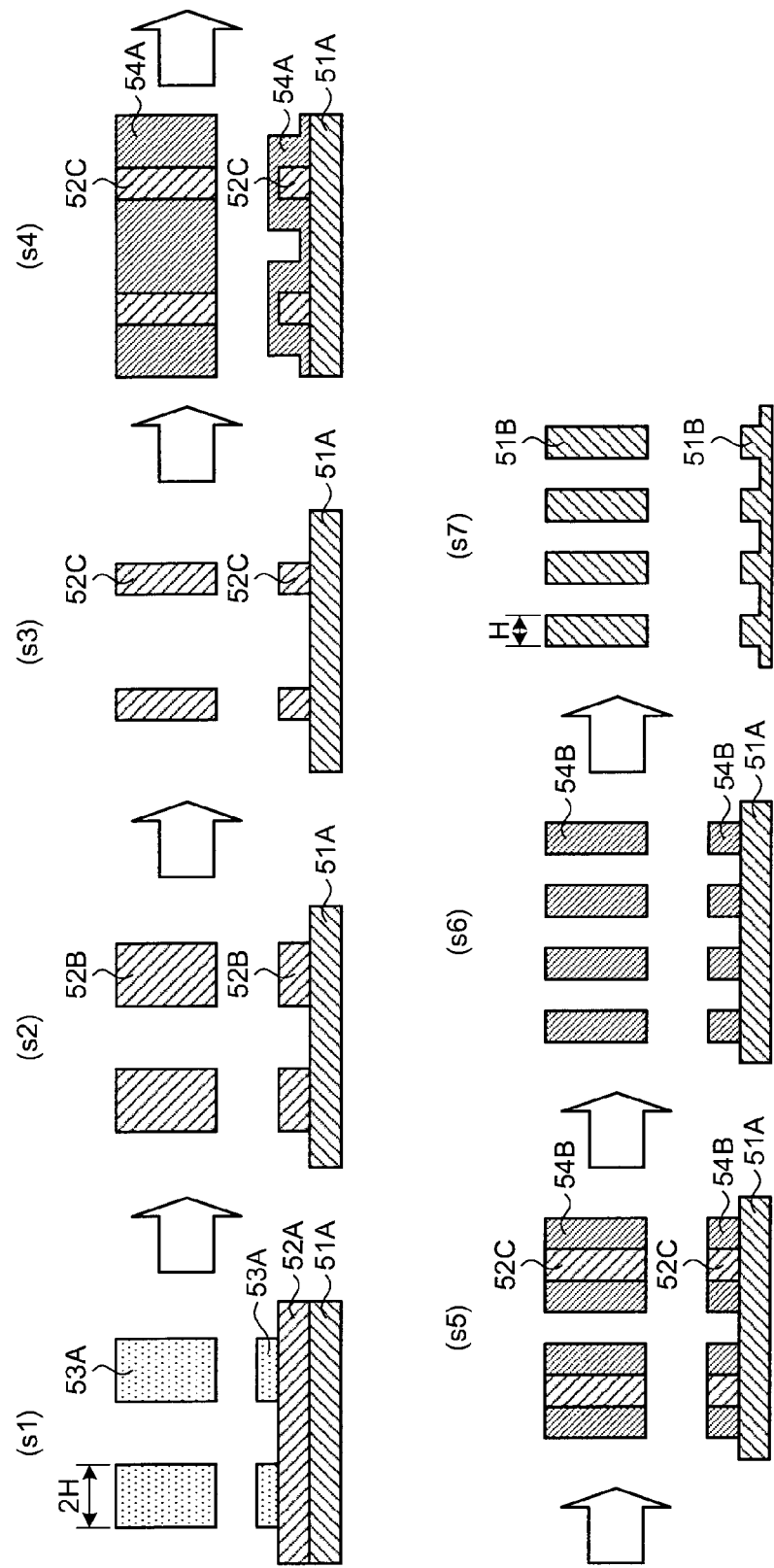
FIG. 5 is a diagram of a process flow of a sidewall line transfer process.

FIG. 5 is a diagram of a process flow of a sidewall line transfer process. The sidewall line transfer process is a process for forming a line pattern same as a sidewall pattern by transferring a sidewall pattern onto a lower layer side. An upper side of processing (s1) to (s7) shown in FIG. 5 is a top view (only a top layer) in pattern formation and a lower side thereof is a sectional view in the pattern formation.

In the sidewall line transfer process, a pattern formation layer 51A as a target of pattern formation is formed on a substrate and a core layer 52A for forming a core is formed on the pattern formation layer 51A. Resist patterns 53A having minimum processing width 2H are formed on the core layer 52A (lithography processing s1).

Thereafter, the core layer 52A is etched with the resist patterns 53A as masks by the reactive ion etching (RIE) method or the like to form core patterns 52B (core processing s2). The core patterns 52B are slimmed to form slimming patterns 52C (slimming processing s3).

A sidewall deposit film 54A such as a nitride film is deposited on the substrate by the chemical vapor deposition (CVD) method or the like (sidewall deposit processing s4). Thereafter, the sidewall deposit film 54A is etched back by anisotropic etching such as the RIE to form sidewall patterns 54B from the sidewall deposit film 54A (etch-back processing s5).

The slimming patterns 52C are wet-etched to remove the slimming patterns 52C and leave only the sidewall patterns 54B on the pattern formation layer 51A (wet-etching processing s6). Thereafter, the pattern formation layer 51A is etched with the sidewall patterns 54B as masks by the RIE or the like to form line patterns 51B (RIE processing s7). This makes it possible to form the line patterns 51B having line width H. In such a sidewall line transfer process, a risk point that can be controlled by lithography is a space section after processing.

Figure 6:
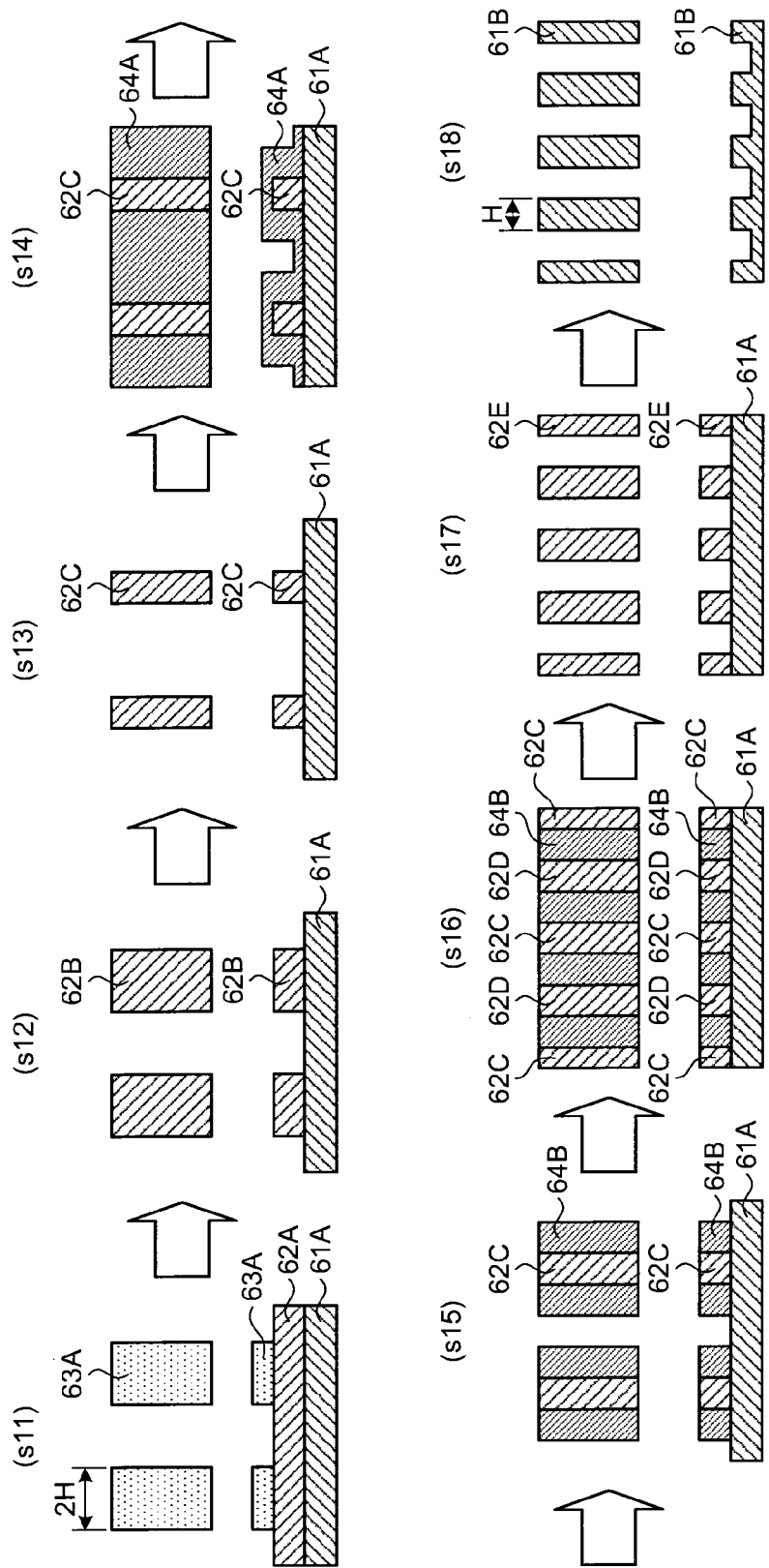
FIG. 6 is a diagram of a process flow of a sidewall space transfer process.

FIG. 6 is a diagram of a process flow of a sidewall space transfer process. The sidewall space transfer process is a process for forming a space pattern same as a sidewall pattern by transferring the sidewall pattern onto a lower layer side. An upper side of processing (s11) to (s18) shown in FIG. 6 is a top view (only a top layer) in pattern formation and a lower side is a sectional view in the pattern formation.

In the sidewall space transfer process, processing same as the sidewall line transfer process is performed until a sidewall pattern is formed. Specifically, a pattern formation layer 61A as a target of pattern formation and a core layer 62A for forming a core are formed on the pattern formation layer 61A. Resist patterns 63A having minimum processing width 2H are formed on the core layer 62A (lithography processing s11).

Thereafter, the core layer 62A is etched with the resist patterns 63A as masks by the RIE method or the like to form core patterns 62B (core processing s12). The core patterns 62B are slimmed to form slimming patterns 62C (slimming processing s13).

A sidewall deposit film 64A such as a nitride film is deposited on the substrate by the CVD method or the like (sidewall deposit processing s14). Thereafter, the sidewall deposit film 64A is etched back by anisotropic etching such as the RIE to form sidewall patterns 64B from the sidewall deposit film 64A (etch-back processing s15).

After the sidewall patterns 64B are formed, materials same as the slimming patterns 62C are embedded in gaps among the sidewall patterns 64B. Consequently, the slimming patterns 62C and embedded patterns 62D are formed in places other than the sidewall patterns 64B. Thereafter, the substrate is planarized by chemical mechanical polishing (CMP) (embedding and CMP processing s16).

Thereafter, the sidewall patterns 64B are wet-etched to remove the sidewall patterns 64B and leave mask patterns 62E corresponding to the slimming patterns 62C and the embedded patterns 62D on the pattern formation layer 61A (wet-etching processing s17). Thereafter, the pattern formation layer 61A is etched with the mask patterns 62E as masks by the RIE or the like to form space patterns 61B (RIE processing s18). This makes it possible to form the space patterns 61B having space width H. In such a sidewall line transfer process, a risk point that can be controlled by lithography is a line section after processing.

In the lithography fluctuation information 41, for example, three conditions are set for each of the lithography conditions: the mask, the dose, the focus, and the illumination σ. In the processing fluctuation information 51, for example, three conditions are set for each of the processing conditions: the slimming amount and the sidewall deposit amount. In other words, a plurality of process parameters are set, in a predetermined range, for the process conditions such as the lithography conditions and the processing conditions. The three conditions in the lithography conditions and the process conditions are, for example, a best value, a value smaller than the best value by an error difference, and a value larger than the best value by the error difference.

The pattern generating system sets, for example, three conditions for the mask and sets the lithography conditions other than the mask and the processing conditions to best values to perform a lithography simulation and a processing simulation for each of the conditions set for the mask. This makes it possible to determine which conditions among the three conditions of the mask is a worst condition. Similarly, the pattern generating system sets, for example, three conditions for any one of the lithography conditions and sets the lithography conditions other than the lithography condition for which the three conditions are set and the processing conditions to best values to perform a lithography simulation and a processing simulation. This makes it possible to determine a worst condition for each of kinds of the lithography conditions and each of kinds of the processing conditions.

The number-of-risk-points extracting unit 11 of the worst-condition calculating apparatus 1 extracts a risk point by comparing the threshold set in advance and a dimension of patterns obtained by a pattern formation simulation. The number-of-risk-points extracting unit 11 extracts risk points from all patterns obtained by the pattern formation simulation for each of the conditions and calculates the number of risk points for each kind of a pattern formation simulation.

The worst-condition calculating unit 12 calculates, according to a factor analysis, a lithography condition under which the number of risk points is the largest as a lithography worst condition. The worst-condition calculating unit 12 calculates, according to the factor analysis, a processing condition under which the number of risk points is the largest as a processing worst condition. Specifically, the worst-condition calculating unit 12 derives, as lithography worst conditions and processing worst conditions, a condition under which the number of risk points is the largest among the conditions of the mask, a condition under which the number of risk points is the largest among the conditions of the dose, a condition under which the number of risk points is the largest among the conditions of the focus, a condition under which the number of risk points is the largest among the conditions of the illumination σ, a condition under which the number of risk points is the largest among the conditions of the slimming amount, and a condition under which the number of risk points is the largest among the conditions of the side deposit amount. The worst-condition calculating unit 12 sends the derived lithography worst conditions and processing worst conditions to the verifying apparatus 6.

Figure 7A:
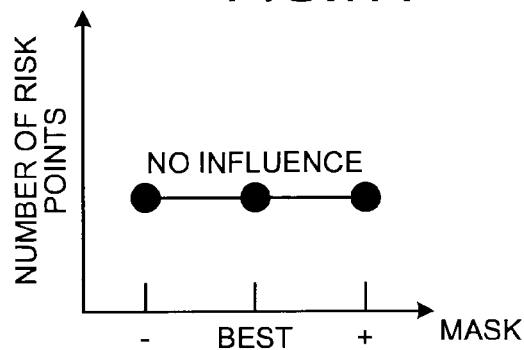
FIGS. 7A to 7D are diagrams for explaining a lithography worst condition.
Figure 7B:
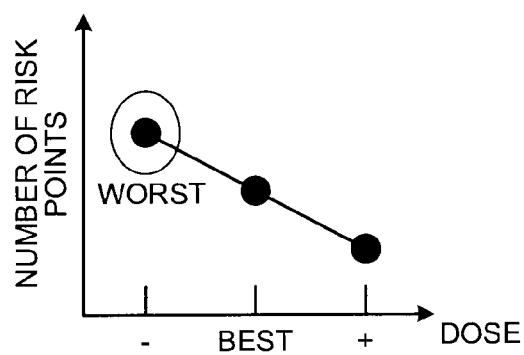
Figure 7C:
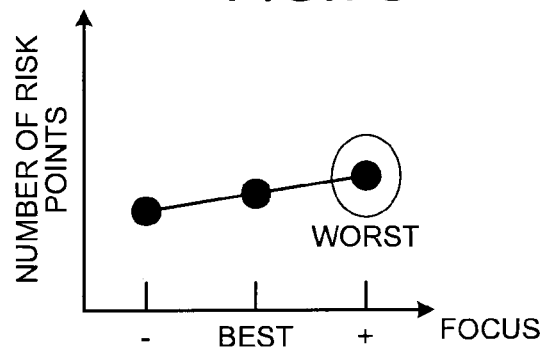
Figure 7D:
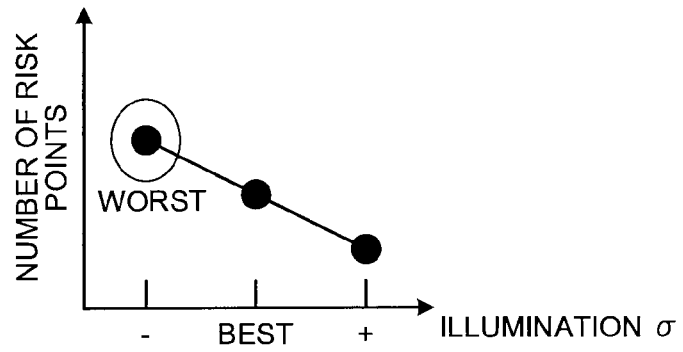

FIGS. 7A to 7D are diagrams for explaining the lithography worst condition. The number of risk points for each of lithography simulation set values is shown. The three conditions of the mask are shown in FIG. 7A. The three conditions of the dose are shown in FIG. 7B. The three conditions of the focus are shown in FIG. 7C. The three conditions of the illumination σ are shown in FIG. 7D.

As shown in FIG. 7A, the three conditions of the mask are, for example, the use of a mask on which a best mask pattern without a manufacturing error is formed, the use of a mask on which a mask pattern having a dimension smaller than that of the best mask pattern because of a manufacturing error is formed, and the user of a mask on which a mask pattern having a dimension larger than that of the best mask pattern because of a manufacturing error is formed. A reduced dimension of the dimension smaller than that of the best mask pattern is a dimension that could be reduced in mask manufacturing. An increased dimension of the dimension larger than that of the best mask pattern is a dimension that could be increased in mask manufacturing. In the three conditions of the mask, for example, the number of risk points is the same in the respective conditions and there is no influence of the mask. Therefore, a worst condition of the mask can be any one of the three conditions.

As shown in FIG. 7B, the three conditions of the dose are, for example, exposure performed with a best dosage without a dose error, exposure performed with a dosage smaller than the best dosage because of a dose error, and exposure performed with a dosage larger than the best dosage because of a dose error. The dosage larger than the best dosage is a dosage that could be increased because of a dose error in exposure. The dosage smaller than the best dosage is a dosage that could be reduced because of a dose error in exposure. For example, in FIG. 7B, the number of risk points is the largest when exposure is performed with the dosage smaller than the best dosage because of a dose error. Therefore, a worst condition of the dose is the exposure performed with the dosage smaller than the best dosage because of a dose error.

As shown in FIG. 7C, the three conditions of the focus are, for example, exposure performed with a best focus value without a focus error, exposure performed with a focus value smaller than the best focus value because of a focus error, and exposure performed with a focus value larger than the best focus value because of a focus error. The focus value larger than the best focus value is a focus value that could be increased because of a focus error in exposure. The focus value smaller than the best focus value is a focus value that could be reduced because of a focus error. For example, in FIG. 7C, the number of risk points is the largest when exposure is performed with the focus value larger than the best focus error because of a focus error. Therefore, a worst condition of the focus is the exposure performed with the focus value larger than the best focus value because of a focus error.

As shown in FIG. 7D, the three conditions of the illumination σ are, for example, exposure performed with best illumination σ without an illumination error, exposure performed with illumination σ smaller than the best illumination σ because of an illumination error, and exposure performed with illumination σ larger than the best illumination σ because of an illumination error. The illumination σ larger than the best illumination σ is illumination σ that could be increased because of an illumination error in exposure. The illumination σ smaller than the best illumination σ is illumination σ that could be reduced because of an illumination error in exposure. For example, in FIG. 7D, the number of risk points is the largest when exposure is performed with the illumination σ smaller than the best illumination σ because of an illumination error. Therefore, a worst condition of the illumination σ is the exposure performed with the illumination σ smaller than the best illumination σ because of an illumination error.

Figure 8A:
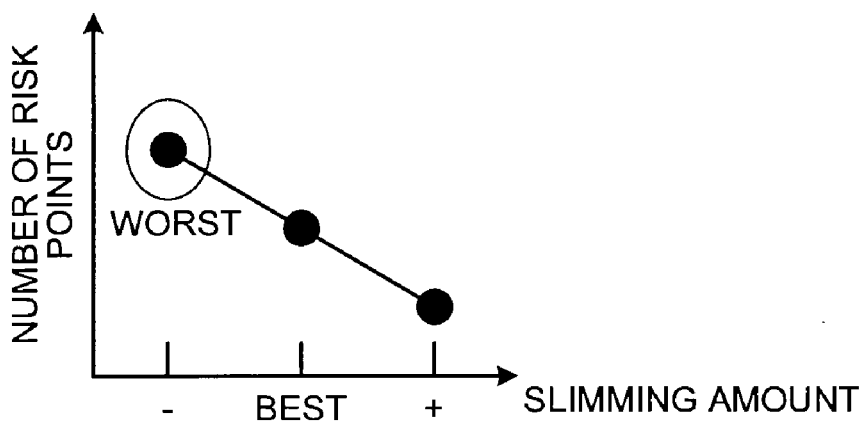
FIGS. 8A and 8B are diagrams for explaining a processing worst condition.
Figure 8B:
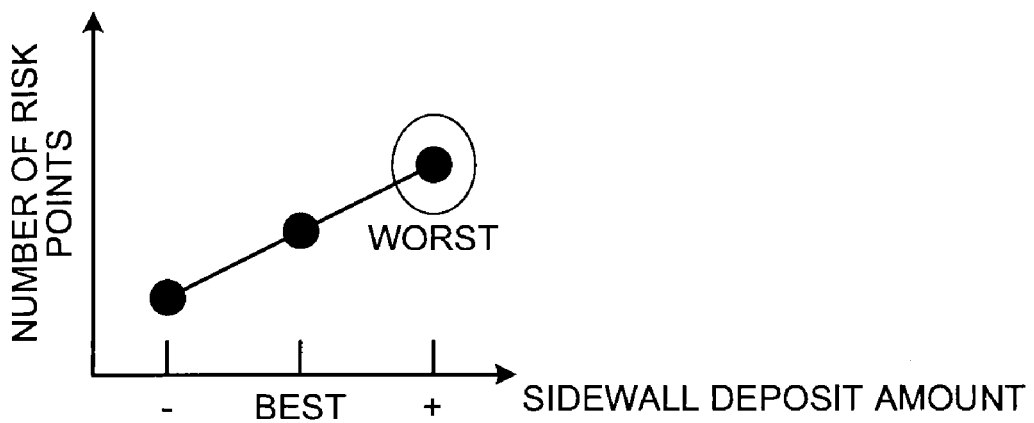

FIGS. 8A and 8B are diagrams for explaining the processing worst condition. The number of risk points for each of processing simulation set values is shown. In FIG. 8A, the three conditions of the slimming amount are shown. In FIG. 8B, the three conditions of the sidewall deposit amount are shown.

As shown in FIG. 8A, the three conditions of the slimming amount are, for example, slimming performed with a best slimming amount without a slimming error, slimming performed with a slimming amount smaller than the best slimming amount because of a slimming error, and slimming performed with a slimming amount larger than the best slimming amount because of a slimming error. The slimming amount larger than the best slimming amount is a slimming amount that could be increased because of a slimming error in slimming. The slimming amount smaller than the best slimming amount is a slimming amount that could be reduced because of a slimming error in slimming. For example, in FIG. 8A, the number of risk points is the largest when slimming is performed with the slimming amount smaller than the best slimming amount smaller than the best slimming amount because of a slimming error. Therefore, a worst condition of the slimming amount is the slimming performed with the slimming amount smaller than the best slimming amount.

As shown in FIG. 8, the three conditions of the sidewall deposit amount are, for example, sidewall deposit performed with a best deposit amount without a deposit error, sidewall deposit performed with a deposit amount smaller than the best deposit amount because of a deposit error, and sidewall deposit performed with a deposit amount larger than the best deposit amount because of a deposit error. The sidewall deposit amount larger than the best deposit amount is a sidewall deposit amount that could be increased because of a deposit error in sidewall deposit. The sidewall deposit amount smaller than the best deposit amount is a sidewall deposit amount that could be reduced because of a deposit error in sidewall deposit. For example, in FIG. 8B, the number of risk points is the largest when the sidewall deposit is performed with the deposit amount larger than the best deposit amount because of a sidewall deposit error. Therefore, a worst condition of the sidewall deposit amount is the sidewall deposit performed with the deposit amount larger than the best deposit amount because of a deposit error.

In the pattern forming system, after the processing simulation is performed (step S130), the number-of-points extracting unit 11 of the worst-condition calculating apparatus 1 extracts the number of risk points equal to or smaller than a threshold (a dimension) set in advance. Specifically, the number-of-risk-point extracting unit 11 extracts, for each of lithography simulation set values of the lithography conditions, the number of risk points that occur when patterns are formed under the lithography conditions specified in the lithography fluctuation information 41. The number-of-risk-points extracting unit 11 extracts, for each of the processing simulation set values of the processing conditions, the number of risk points that occur when patterns are formed under the processing conditions specified in the processing fluctuation information 51 (step S140).

The worst-condition calculating unit 12 calculates, according to a factor analysis, a lithography worst condition and a processing worst condition under which the number of risk points is the largest (step S150). The worst-condition calculating unit 12 sends the calculated lithography worst condition and processing worst condition to the verifying apparatus 6. Thereafter, the verifying apparatus 6 performs lithography verification using the lithography worst condition and performs processing verification using the processing worst condition. The design layout data, the OPC, the process conditions, and the like are changed such that the number of risk points decreases to be smaller than the number of risk points calculated by the lithography simulation and the processing simulation even when patterns are formed under the worst conditions.

When the design layout data and the OPC are changed, mask data is created according to a flow of the flowchart shown in FIG. 3. When the process conditions are changed, mask data used in processing verification immediately before the change is determined as mask data for pattern formation.

The pattern generating system creates mask data for each of layers according to a flow of the flowchart shown in FIGS. 3 and 4. The pattern generating system creates a mask using the created mask data. When a semiconductor device is manufactured, exposure processing using the mask and processing such as etching and film formation are performed in the layers. A semiconductor device is manufactured by repeating the exposure processing and the processing.

As explained above, the pattern generating system derives worst conditions for each of the lithography conditions and each of the processing conditions to thereby derive a worst condition in performing pattern formation. In this embodiment, for example, the dose smaller than the best dose, the focus larger than the best focus, the illumination σ smaller than the best illumination σ, the slimming amount smaller than the best slimming amount, and the sidewall deposit amount larger than the best sidewall deposit amount are worst conditions in performing pattern formation.

As explained above, the lithography simulation apparatus 4 performs a lithography simulation for, for example, each of the lithography simulation set values of the lithography conditions (each of the kinds of the lithography conditions). The processing simulation apparatus 5 performs a processing simulation for each of the processing simulation set values of the processing conditions (each of the kinds of the processing conditions). The lithography simulation apparatus 4 determines a worst condition out of the lithography conditions, determines a worst condition out of the processing conditions, and combines the worst conditions to derive a worst condition in pattern formation.

The lithography simulation apparatus 4 can combine all the lithography conditions and all the processing conditions to perform a pattern formation simulation. For example, the lithography simulation apparatus 4 sets three conditions for each of the mask, the dose, the focus, the illumination σ, the slimming amount, and the sidewall deposit amount to thereby perform seven hundred twenty-nine kinds of pattern formation simulations. The number-of-risk-points extracting unit 11 extracts risk points from all patterns obtained by the seven hundred twenty-nine kinds of pattern formation simulations and calculates the number of risk points in each of the kinds of pattern formation simulations. The number-of-risk-points extracting unit 11 extracts a pattern formation simulation having the largest number of risk points among seven hundred twenty-nine simulation results and sets a condition used for the pattern formation simulation as a worst condition.

In the explanation of this embodiment, the verifying apparatus 6 performs the lithography verification and the processing verification. However, the lithography simulation apparatus 4 can perform the lithography verification and the processing simulation apparatus 5 can perform the processing verification.

In the explanation of this embodiment, the lithography simulation apparatus 4 performs the lithography simulation using the mask data after OPC. However, the verifying apparatus 6 can perform the lithography simulation using the mask data after OPC.

In the explanation of this embodiment, the processing simulation apparatus 5 performs the processing simulation using the mask data after OPC. However, the verifying apparatus 6 can perform the processing simulation using the mask data after OPC.

In the explanation of this embodiment, the number of risk points after pattern formation is calculated. However, the risk points can be weighted. For example, the number-of-risk-points extracting unit 11 classifies the risk points based on the level of likelihood (the risk) of a pattern failure. The worst-condition calculating unit 12 calculates a worst condition based on a risk degree of the risk points and the number of risk points. This makes it possible to calculate an accurate worst condition with the probability of a pattern formation failure taken into account.

As explained above, according to the first embodiment, the lithography worst condition and the processing worst condition in forming final patterns are calculated with fluctuation in lithography and fluctuation in processing at a stage of design layout taken into account. This makes it possible to generate a mask pattern with a small number of risk points even under a worst condition. Therefore, it is possible to perform robust pattern formation in which a pattern failure less easily occurs. Because the mask data with a small number of risk points is generated by using the lithography simulation and the processing simulation in advance, it is possible to reduce development turn-around-time (TAT) for products.

A worst condition is determined out of the lithography conditions and a worst condition is determined out of the processing conditions. Therefore, it is possible to easily calculate a worst condition even when a new lithography condition or a new processing condition is added.

A worst condition is determined based on a simulation result obtained by combining all the lithography conditions and all the processing conditions. This makes it possible to extract risk points caused by the combination. Risk points prevented from occurring by the combination are not extracted. Therefore, it is possible to extract accurate risk points.

In a second embodiment of the present invention, it is determined based on a difference (a CD difference) between a pattern dimension of simulatively-generated patterns and a best dimension whether patterns formed on a substrate are within a desired dimension range. When the patterns are not within the desired dimension range, design layout data, OPC, process conditions, and the like are changed to form patterns on the substrate. The best dimension in this embodiment is a pattern dimension (an ideal value) of patterns formed under a best condition.

Figure 9:
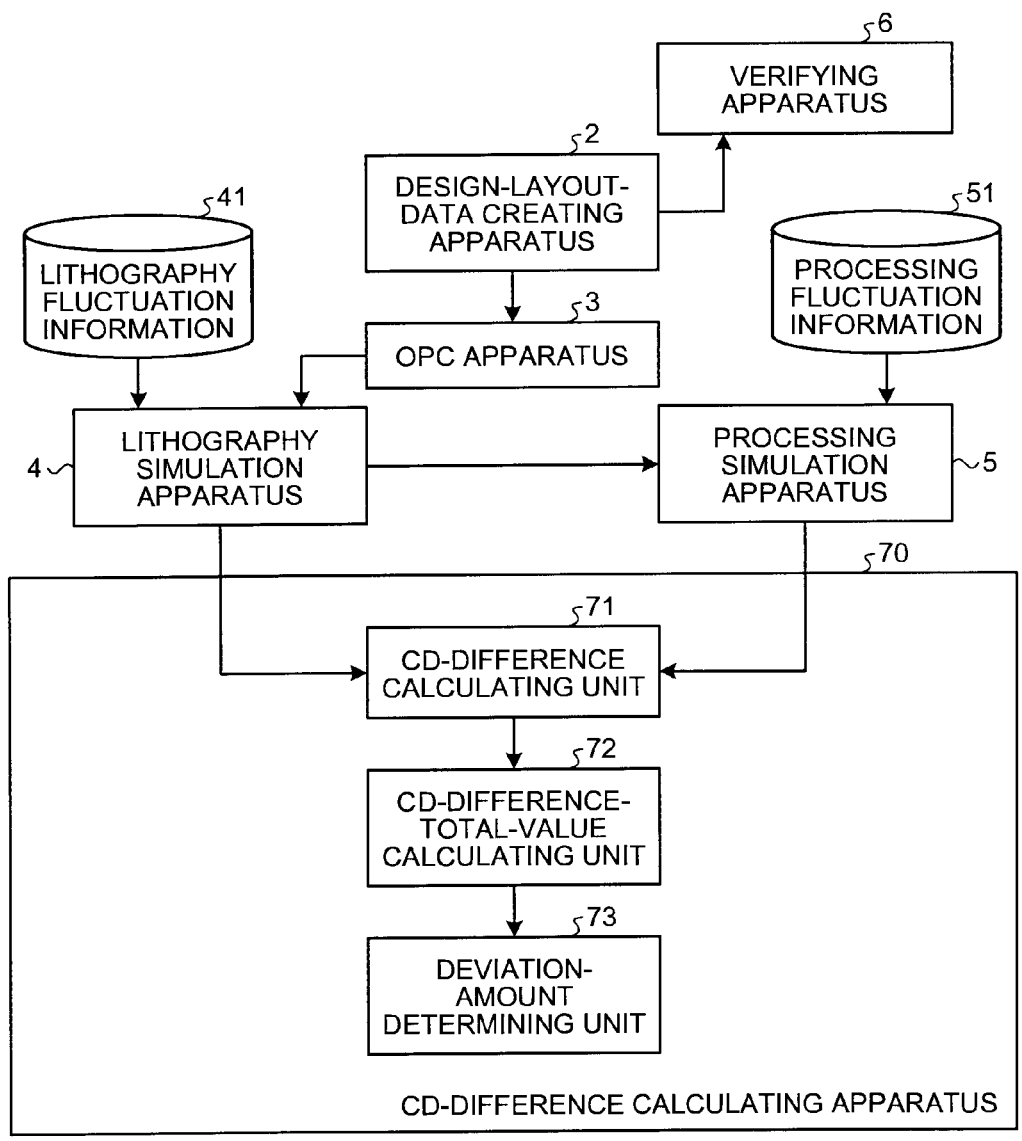
FIG. 9 is a block diagram of the configuration of a pattern forming system including a CD-difference calculating apparatus according to a second embodiment of the present invention.

FIG. 9 is a block diagram of the configuration of a pattern forming system including a CD-difference calculating apparatus according to the second embodiment. Among components shown in FIG. 9, components that attain functions same as those of the pattern forming system according to the first embodiment shown in FIG. 1 are denoted by the same reference numerals and redundant explanation of the components is omitted.

The pattern forming system according to this embodiment performs a lithography simulation and a processing simulation taking into account fluctuation in lithography and fluctuation in processing to thereby simulatively generate patterns to be formed on a substrate. The pattern forming system determines based on a CD difference between the simulatively-generated patterns and the best dimension whether patterns to be formed on the substrate are within a desired dimension range. In this embodiment, patterns are formed on the substrate by changing the design layout data, the OPC, the process conditions, and the like such that the CD difference between the simulatively-generated pattern and the best dimension falls within a predetermined range.

The pattern forming system includes a CD-difference calculating apparatus 70, the design-layout-data creating apparatus 2, the OPC apparatus 3, the lithography simulation apparatus 4, the processing simulation apparatus 5, and the verifying apparatus 6.

The CD-difference calculating apparatus 70 is an apparatus that calculates a CD difference between simulatively-generated patterns and the best dimension using a simulation result derived by the processing simulation apparatus 5.

The CD-difference calculating apparatus 70 includes a CD-difference calculating unit 71, a CD-difference-total-value calculating unit 72, and a deviation-amount determining unit 73. The CD-difference calculating unit 71 calculates lithography fluctuation (a deviation amount from the best dimension) (a lithography deviation amount $\Delta CD1$ explained later) using patterns generated by the lithography simulation. The CD-difference calculating unit 71 calculates an absolute value $\Delta CD2$ of the calculated lithography deviation amount $\Delta CD1$ using the lithography deviation amount $\Delta CD1$. The CD-difference calculating unit 71 calculates processing fluctuation (a processing deviation amount $\Delta CD3$ explained later) using patterns generated by the processing simulation. The CD-difference calculating unit 71 calculates an absolute value $\Delta CD4$ of the calculated processing deviation amount $\Delta CD3$ using the processing deviation amount $\Delta CD3$.

The CD-difference-total-value calculating unit 72 totals the absolute value $\Delta CD2$ and the absolute value $\Delta CD4$ calculated by the CD-difference calculating unit 71 to thereby calculate a deviation amount of patterns to be formed on the substrate from the best dimension (a CD difference total value).

The deviation-amount determining unit 73 compares the CD difference total value calculated by the CD-difference-total-value calculating unit 72 and a predetermined value (a threshold) set in advance to thereby determine whether the CD difference total value is smaller than the threshold. In this way, the deviation-amount determining unit 73 determines whether the patterns to be formed on the substrate are within the desired dimension range.

When the deviation-amount determining unit 73 determines that the CD difference total value is not within a predetermined range, the design layout data, the OPC, the process conditions, and the like are changed such that the CD difference between the simulatively-generated pattern and the best dimension falls within the predetermined range.

The verifying apparatus 6 according to this embodiment is connected to the OPC apparatus 3. The verifying apparatus 6 performs lithography verification and processing verification using mask data after OPC created by the OPC apparatus 3. When verification results of the lithography verification and the processing verification are acceptable, patterns are formed on the substrate by using the mask data after OPC created by the OPC apparatus 3.

Figure 10:
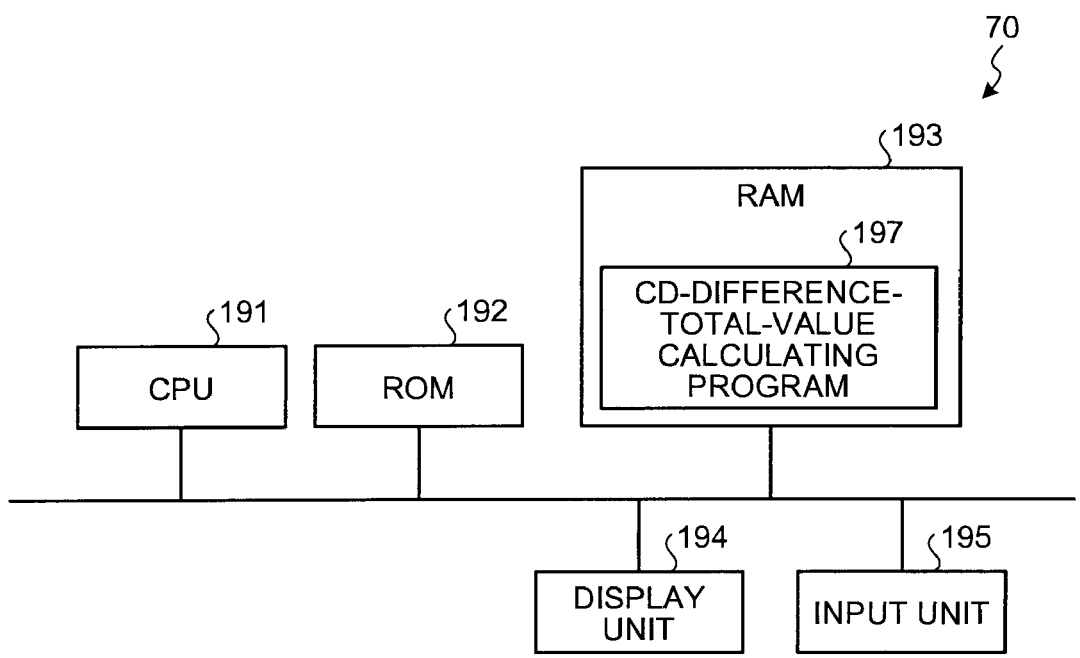
FIG. 10 is a diagram of the hardware configuration of the CD-difference calculating apparatus.

FIG. 10 is a diagram of the hardware configuration of the CD-difference calculating apparatus 70. As shown in FIG. 10, the CD-difference calculating apparatus 70 is different from the worst-condition calculating apparatus 1 in a computer program stored in the apparatus.

The CD-difference calculating apparatus 70 is an apparatus such as a computer that calculates a dimension difference between the best dimension and simulatively-generated patterns. The CD-difference calculating apparatus 70 includes a CPU 191, a ROM 192, a RAM 193, a display unit 194, and an input unit 195. The CPU 191, the ROM 192, the RAM 193, the display unit 194, and the input unit 195 respectively have functions same as those of the CPU 91, the ROM 92, the RAM 93, the display unit 94, and the input unit 95 of the worst-condition calculating apparatus 1. In the CD-difference calculating apparatus 70, the CPU 191, the ROM 192, the RAM 193, the display unit 194, and the input unit 195 are connected via a bus line.

The CPU 191 calculates a CD difference total value using a CD-difference-total-value calculating program 197, which is a computer program for calculating a dimension difference between the best dimension and simulatively-generated patterns.

The display unit 194 is a display device such as a liquid crystal monitor. The display unit 194 displays, based on instructions from the CPU 191, the design layout data, the mask data after OPC, a lithography simulation result, a processing simulation result, the lithography deviation amount ΔCD1, the processing deviation amount ΔCD3, the absolute value ΔCD2, the absolute value ΔCD4, the CD difference total value, the lithography fluctuation information 41, the processing fluctuation information 51, and the like. The input unit 195 receives the input of instruction information (parameters, etc. necessary for calculation of a CD difference total value) externally input from a user. The instruction information input to the input unit 195 is sent to the CPU 191.

The CD-difference-total-value calculating program 197 is stored in the ROM 192 and loaded into the RAM 193 via the bus line. The CPU 191 executes the CD-difference-total-value calculating program 197 loaded into the RAM 193. Specifically, in the CD-difference-calculating apparatus 70, according to instruction input from the input unit 195 by the user, the CPU 191 reads out the CD-difference-total-value calculating program 197 from the ROM 192, expands the CD-difference-total-value calculating program 197 in a program storage area in the RAM 193, and executes various kinds of processing. The CPU 191 causes a data storage area formed in the RAM 193 to temporarily store various data generated in the various kinds of processing.

Figure 11:
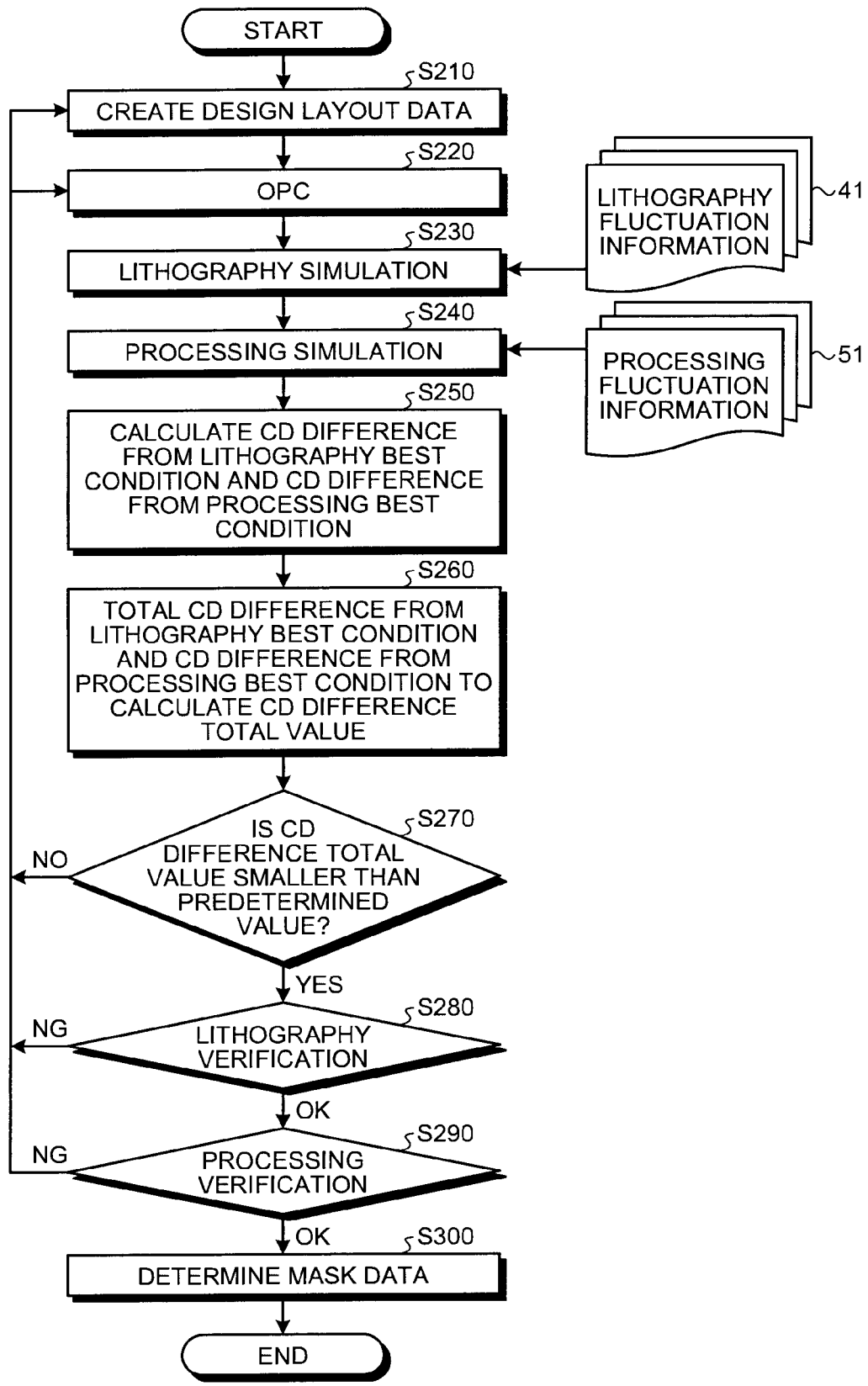
FIG. 11 is a flowchart of an operation procedure of the pattern forming system according to the second embodiment.

FIG. 11 is a flowchart for explaining an operation procedure of the pattern forming system according to the second embodiment. Among kinds of processing shown in FIG. 11, explanation of kinds of processing same as those shown in FIGS. 3 and 4 is omitted.

In the pattern forming system, the design-layout-data creating apparatus 2 creates design layout data of patterns (step S210). The OPC apparatus 3 applies OPC processing to the design layout data created by the design-layout-data creating apparatus 2 and creates mask data after OPC (step S220).

The lithography simulation apparatus 4 performs a lithography simulation using the mask data after OPC and the lithography fluctuation information 41 (step S230). The processing simulation apparatus 5 performs a processing simulation using a simulation result of the lithography simulation and the processing fluctuation information 51 (step S240).

Thereafter, the CD-difference calculating apparatus 70 calculates a CD difference between patterns to be formed on a wafer and the best dimension using patterns generated by the lithography simulation and patterns generated by the processing simulation.

Figure 12:
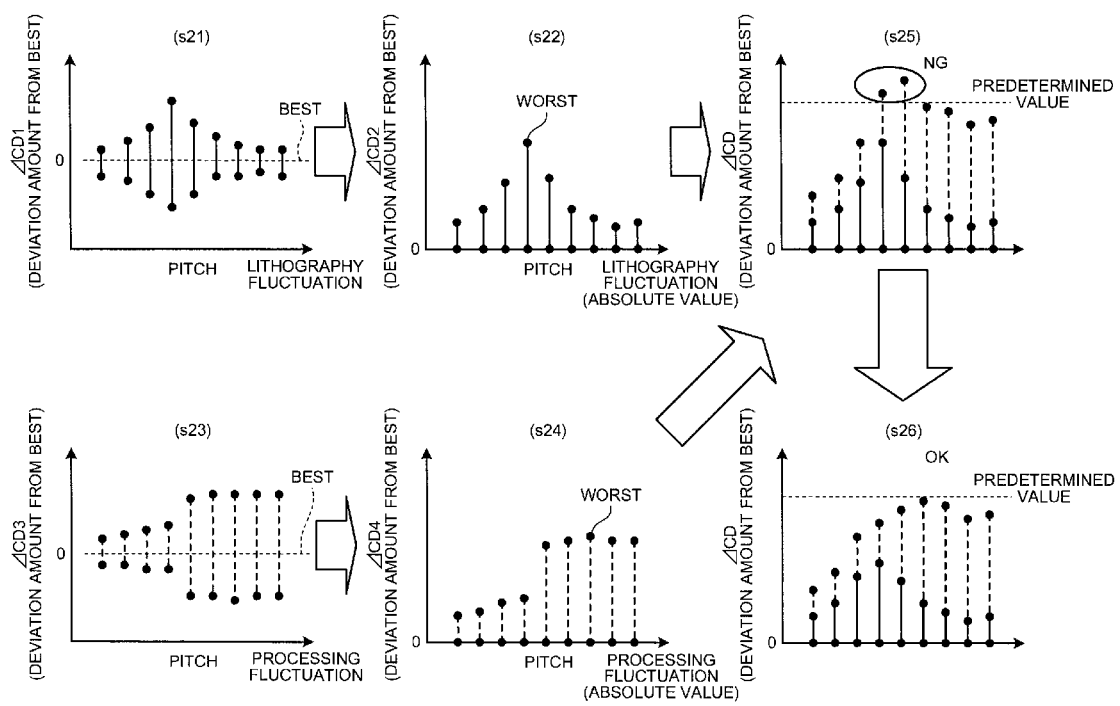
FIG. 12 is a diagram for explaining processing for calculating a CD difference between patterns formed on a wafer and a best dimension.

FIG. 12 is a diagram for explaining processing for calculating a CD difference between patterns to be formed on a wafer and the best dimension. The CD-difference calculating unit 71 calculates, based on the simulation result obtained by the lithography simulation, for each of pitches, dimension fluctuation (a deviation amount from the best dimension) of patterns to be formed as the lithography deviation amount ΔCD1 (a lithography dimension difference) (lithography fluctuation) (s21). The lithography deviation amount ΔCD1 is a minus value when the patterns are smaller than the best dimension and is a plus value when the patterns are larger than the best dimension.

The CD-difference calculating unit 71 extracts, for each of the pitches, a minimum and a maximum of the lithography deviation amount ΔCD1. The CD-difference calculating unit 71 calculates, for each of the pitches, the absolute value ΔCD2 of the extracted lithography deviation amount ΔCD1 for each of the pitches (an absolute value of lithography fluctuation) using the lithography deviation amount ΔCD1 (s22). The absolute value ΔCD2 is a CD difference from a lithography best condition and is a larger one of an absolute value of the minimum of the lithography deviation amount ΔCD1 and an absolute value of the maximum of the lithography deviation amount ΔCD1.

The CD-difference calculating unit 71 calculates, based on a simulation result obtained by the processing simulation, for each of the pitches, dimension fluctuation (a deviation amount from the best dimension) of patterns to be formed as the processing deviation value ΔCD3 (a processing dimension difference) (processing fluctuation) (s23). The processing deviation amount ΔCD3 is a minus value when the patterns are smaller than the best dimension and is a plus value when the patterns are larger than the best dimension.

The CD-difference calculating unit 71 extracts, for each of the pitches, a minimum and a maximum of the processing deviation amount ΔCD3. The CD-difference calculating unit 71 calculates, for each of the pitches, the absolute value ΔCD4 of the extracted processing deviation amount ΔCD3 for each of the pitches (an absolute value of processing fluctuation) using the processing deviation amount ΔCD3 (s24). The absolute value ΔCD4 is a CD difference from a processing best condition and is a larger one of an absolute value of the minimum of the processing deviation amount ΔCD3 and an absolute value of the maximum of the processing deviation amount ΔCD3 (step S250).

Subsequently, the CD-difference-total-value calculating unit 72 totals the absolute value ΔCD2, which is the CD difference from the lithography best condition, and the absolute value ΔCD4, which is the CD difference from the processing best condition, to thereby calculate a CD difference total value (a dimension difference total value), which is a total CD difference (step S260) (s25).

The deviation-amount determining unit 73 compares the CD difference total value calculated by the CD-difference-total-value calculating unit 72 and a threshold set in advance and determines whether the CD difference total value is smaller than the threshold (step S270). In this way, the deviation-amount determining unit 73 determines whether patterns to be formed on the substrate are within a desired dimension range.

When the deviation-amount determining unit 73 determines that the CD difference total value is larger than the threshold ("No" at step S270), the design layout data, the OPC, the process conditions (a lighting condition and a processing condition), and the like are changed such that the CD difference total value decreases to be smaller than the threshold. In other words, the design layout, the OPC, the process conditions, and the like are changed such that the CD difference between the simulatively-generated patterns and the best dimension falls within the predetermined range (s26).

In changing the design layout data, the design-layout-data creating apparatus 2 creates design layout data anew (step S210). Thereafter, the pattern forming system performs the processing at steps S220 to S270.

In changing the OPC, the OPC apparatus 3 applies new OPC processing to the design layout data to create mask data after OPC (step S220). Thereafter, the pattern forming system performs the processing at steps S230 to S270.

The pattern forming system performs the processing at steps S210 to S270 or the processing at steps S220 to S270 until the CD difference total value decrease to be smaller than the threshold. When the CD difference total value is smaller than the threshold ("Yes" at step S270), the verifying apparatus 6 performs lithography verification using the latest mask data created at step S220 (step S280) and performs processing verification using a verification result of the lithography verification (step S290).

When the verifying apparatus 6 extracts a risk point in the lithography verification ("NG" at step S280) or when the verifying apparatus 6 extracts a risk point in the processing verification ("NG" at step S290), the design layout data, the OPC, the process conditions, and the like are changed.

In changing the design layout data, the design-layout-data creating apparatus 2 creates design layout data anew (step S210). Thereafter, the pattern forming system performs the processing at steps S220 to S270.

In changing the OPC, the OPC apparatus 3 applies new OPC processing to the design layout data to create mask data after OPC (step S220). Thereafter, the pattern forming system performs the processing at steps S230 to S270.

The pattern forming system repeats processing for changing any one of the design layout data, the OPC, and the process conditions until the CD difference total value decreases to be smaller than the threshold and the verifying apparatus 6 does not extract risk points in the lithography verification and the processing verification. When the verifying apparatus 6 does not extract a risk point in the lithography verification ("OK" at step S280) and does not extract a risk point in the processing verification ("OK" at step S290), the pattern forming system determines, as mask data for mask creation, mask data after OPC in which no risk point is extracted (step S300).

When the CD difference total value is larger than the threshold and when the process conditions are changed, for example, the setting slimming amount or the like in the sidewall formation process is changed. Thereafter, the verifying apparatus 6 performs lithography verification (step S280) and performs processing verification (step S290). When the verifying apparatus 6 does not extract a risk point in the lithography verification ("OK" at step S280) and does not extract a risk point in the processing verification ("OK" at step S290), the pattern forming system determines, as mask data for mask formation, mask data in which no risk point is extracted (step S300).

As explained above, according to the second embodiment, a CD difference total value is calculated with fluctuation in lithography and fluctuation in processing taken into account and it is determined based on the CD difference total value whether patterns to be formed on the substrate are within the desired dimension range. This makes it possible to generate a mask pattern, a CD difference total value of which is within the dimension range. Therefore, it is possible to perform robust pattern formation in which a pattern failure less easily occurs.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A pattern generating method comprising:
    applying OPC processing to design layout data of a semiconductor integrated circuit pattern by using a computer;
    performing pattern formation simulations based on the design layout data subjected to OPC processing with a plurality of process parameters set in process conditions in a predetermined range by using the computer;
    extracting a number of risk points having likelihood of causing a pattern formation failure higher than a predetermined value or a risk degree of the risk points, and calculating, as a worst condition, based on the number of the risk points or the risk degree of the risk points, a process condition having a process parameter that brings about a worst result when pattern formation is performed among the process parameters, the risk point being extracted from simulation results of the pattern formation simulations by using the computer; and
    changing the design layout data or the OPC processing such that when a pattern is formed under the worst condition based on the changed design layout data or the changed OPC processing a number of the risk points or a risk degree of the risk points of the pattern is smaller than the simulation result by using the computer.

2. The pattern generating method according to claim 1, wherein
    the process conditions are lithography conditions or processing conditions, and
    by using the computer, the worst condition is calculated for each of kinds of the lithography conditions or each of kinds of the processing conditions.

3. The pattern generating method according to claim 2, wherein, when the worst condition is calculated, by using the computer, the pattern formation simulations are performed by setting the lithography conditions and the processing conditions to a target pattern while the lithography conditions and the processing conditions are best process conditions for another pattern.

4. The pattern generating method according to claim 1, wherein
    the process conditions are lithography conditions or processing conditions,
    by using the computer, the pattern formation simulations are performed by combining lithography parameters set in the respective lithography conditions and processing parameters set in the respective processing conditions, and
    the worst condition is a combination of the lithography parameters and the processing parameters used for a pattern formation simulation in which worst pattern is formed among the pattern formation simulations.

5. The pattern generating method according to claim 1, wherein
the process conditions are lithography conditions, and
the predetermined range is a deviation amount from a lithography reference value of the lithography conditions.

6. The pattern generating method according to claim 1, wherein
the process conditions are processing conditions, and
the predetermined range is a deviation amount from a processing reference value of the processing conditions.

7. The pattern generating method according to claim 1, wherein the predetermined range includes at least one kind of fluctuation of the process conditions that could occur in a wafer surface, between wafers, between lots, between apparatuses, between products, and in aged deterioration.

8. The pattern generating method according to claim 1, wherein the lithography conditions include at least one of a pattern dimension on a mask, an exposure dose amount, a focus value, exposure wavelength, an illumination shape, an illumination luminance distribution, a lens numerical aperture, a polarization degree, aberration, and pupil transmittance.

9. The pattern generating method according to claim 1, wherein the processing conditions include at least one of a slimming amount and a sidewall deposit amount in a sidewall formation process.

10. A method of manufacturing a semiconductor device comprising:
preparing design layout data of a semiconductor integrated circuit pattern;
performing pattern formation simulations based on the design layout data subjected to OPC processing with a plurality of process parameters set in process conditions in a predetermined range;
extracting a number of risk points having likelihood of causing a pattern formation failure higher than a predetermined value or a risk degree of the risk points, and calculating, as a worst condition, based on the number of the risk points or the risk degree of the risk points, a process condition having a process parameter that brings about a worst result when pattern formation is performed among the process parameters, the risk point being extracted from simulation results of the pattern formation simulations;
changing the design layout data or the OPC processing such that when a pattern is formed under the worst condition based on the changed design layout data or the changed OPC processing a number of the risk points or a risk degree of the risk points of the pattern is smaller than the simulation result; and
forming a pattern on a wafer based on the changed design layout data or the changed OPC processing.

11. The method of manufacturing a semiconductor device according to claim 10, wherein
the process conditions are lithography conditions or processing conditions, and
the worst condition is calculated for each of kinds of the lithography conditions or each of kinds of the processing conditions.

12. The method of manufacturing a semiconductor device according to claim 11, wherein, when the worst condition is calculated, the pattern formation Simulations are performed by setting the lithography conditions and the processing conditions to a target pattern while the lithography conditions and the processing conditions are best process conditions for another pattern.

13. The method of manufacturing a semiconductor device according to claim 10, wherein
the process conditions are lithography conditions or processing conditions,
the pattern formation simulations are performed by combining lithography parameters set in the respective lithography conditions and processing parameters set in the respective processing conditions, and
the worst condition is a combination of the lithography parameters and the processing parameters used for a pattern formation simulation in which worst pattern is formed among the pattern formation simulations.

14. The method of manufacturing a semiconductor device according to claim 10, wherein
the process conditions are lithography conditions, and
the predetermined range is a deviation amount from a lithography reference value of the lithography conditions.

15. The method of manufacturing a semiconductor device according to claim 10, wherein
the process conditions are processing conditions, and
the predetermined range is a deviation amount from a processing reference value of the processing conditions.

16. The method of manufacturing a semiconductor device according to claim 10, wherein the lithography conditions include at least one of a pattern dimension on a mask, an exposure dose amount, a focus value, exposure wavelength, an illumination shape, an illumination luminance distribution, a lens numerical aperture, a polarization degree, aberration, and pupil transmittance.

17. The method of manufacturing a semiconductor device according to claim 10, wherein the processing conditions include at least one of a slimming amount and a sidewall deposit amount in a sidewall formation process.

18. A non-transitory computer-readable recording medium having a program that causes a computer to perform:
preparing design layout data of a semiconductor integrated circuit pattern;
extracting a number of risk points having likelihood of causing a pattern formation failure higher than a predetermined value or a risk degree of the risk points from a result obtained by executing pattern formation simulations on design layout data of a semiconductor integrated circuit pattern subjected to OPC processing using process conditions in which a plurality of parameters are set in a predetermined range;
calculating, as a worst condition, based on the number of the risk points or the risk degree of the risk points, a process condition having a process parameter that brings about a worst result when pattern formation is performed among the process parameters; and
changing the design layout data or the OPC processing such that when a pattern is formed under the worst condition based on the changed design layout data or the changed OPC processing a number of the risk points or a risk degree of the risk points of the pattern is smaller than the simulation result.

* * * * *